(12) United States Patent
Imai et al.

(10) Patent No.: US 8,309,164 B2
(45) Date of Patent: Nov. 13, 2012

(54) METALLIZED SUBSTRATE AND METHOD FOR PRODUCING THE SAME

(75) Inventors: Tetsuo Imai, Yamaguchi (JP); Osamu Yatabe, Yamaguchi (JP); Masakatsu Maeda, Yamaguchi (JP)

(73) Assignee: Tokuyama Corporation, Yamaguchi (JP)

( * ) Notice: Subject to any disclaimer, the term of this patent is extended or adjusted under 35 U.S.C. 154(b) by 267 days.

(21) Appl. No.: 12/602,828

(22) PCT Filed: Jun. 10, 2008

(86) PCT No.: PCT/JP2008/060615
§ 371 (c)(1),
(2), (4) Date: Dec. 3, 2009

(87) PCT Pub. No.: WO2008/153026
PCT Pub. Date: Dec. 18, 2008

(65) Prior Publication Data
US 2010/0183898 A1      Jul. 22, 2010

(30) Foreign Application Priority Data
Jun. 12, 2007  (JP) ................................. 2007-155706

(51) Int. Cl.
*B05D 3/10*    (2006.01)
*B05D 5/12*    (2006.01)
*B05D 5/00*    (2006.01)

(52) U.S. Cl. ..... 427/99.5; 427/305; 427/438; 427/443.1

(58) Field of Classification Search ................. 427/99.5, 427/304, 305, 437, 438, 443.1
See application file for complete search history.

(56) References Cited

U.S. PATENT DOCUMENTS

| | | | |
|---|---|---|---|
| 3,887,732 A * | 6/1975 | Parker et al. .................. | 427/380 |
| 6,259,161 B1 * | 7/2001 | Wu et al. ....................... | 257/766 |

FOREIGN PATENT DOCUMENTS

| JP | 10-065297 A | 3/1998 |
|---|---|---|
| JP | 10-219469 A | 8/1998 |
| JP | 2001-060760 A | 3/2001 |
| JP | 2003-218501 A | 7/2003 |
| JP | 2004-019003 A | 1/2004 |
| JP | 2006-196648 A | 7/2006 |

OTHER PUBLICATIONS

International Search Report: PCT/JP2008/060615.

* cited by examiner

*Primary Examiner* — Dah-Wei Yuan
*Assistant Examiner* — Nga Leung V Law
(74) *Attorney, Agent, or Firm* — Ladas & Parry LLP

(57) ABSTRACT

A metallized substrate having, disposed in the order mentioned: a ceramics substrate; a high-melting point metal layer; a base nickel plating layer; a layered nickel-phosphorous plating layer; a diffusion-inhibiting plating layer; and a gold plating layer. The base nickel plating layer being any one of a nickel plating layer, a nickel-boron plating layer, or a nickel-cobalt plating layer. The diffusion-inhibiting plating layer being any one of a columnar nickel-phosphorous plating layer, a palladium-phosphorous plating layer, or a palladium plating layer. According to the above composition, even after heating the semiconductor chips in a mounted state, the metallized substrate can make the connection strength of wire bonding favorable.

5 Claims, 2 Drawing Sheets

METALLIZED SUBSTRATE AND METHOD FOR PRODUCING THE SAME

TECHNICAL FIELD

The present invention relates to a metallized substrate for mounting semiconductor chips and a method for producing the same.

BACKGROUND ART

When mounting semiconductor chips on a ceramics substrate on which a metallized layer made of a high-melting point metal is formed, the semiconductor chips and the metallized layer are electrically-connected by wire bonding. However, gold wire and aluminum wire cannot be wire-bonded directly on the metallized layer made of the high-melting point metal. So, the surface of the metallized layer is plated in advance and then wire bonding is carried out through the plating. The plating formed on the metallized layer, for example, has a structure in which an electroless nickel plating, a substitute gold plating, and an electroless gold plating are sequentially formed.

To connect semiconductor chips on the metallized substrate, it is necessary to dispose the semiconductor chips on the plating surface through gold tape and/or brazing filler metal and to treat them thermally. However, a nickel component derived from the base nickel plating tends to diffuse in the gold plating during the thermal treatment which tarnishes the surface of gold plating and which deteriorates connection strength of wire bonding.

As attempts to solve these problems, Patent document 1 discloses a process to inhibit diffusion of the nickel component to the gold plating layer by the steps of: forming a nickel plating layer on a metallized layer made of a high-melting point metal; crystallizing the nickel plating layer by heating; and gold plating on the nickel plating layer. Patent document 2 discloses that adhesiveness between a nickel plating layer and a gold plating layer can be improved by adjusting the temperature range of thermal treatment (sintering step).

Patent Document 1: Japanese Patent Application Laid-Open (JP-A) No. 10-065297
Patent Document 2: JP-A No. 10-219469

DISCLOSURE OF THE INVENTION

Problems to be Solved by the Invention

According to the additional tests carried out by the present inventors, however, when sintering the nickel plating layer, connection strength of wire bonding cannot be improved even after heating the semiconductor chips in a mounted state.

By analyzing the cause, it is found out that when thermal treatment is carried out to connect semiconductor chips to a die attach, if the temperature is high and the duration is long, sufficient effect is not necessarily obtained using the method of the above patent documents; diffusion of the nickel component into the gold plating layer is discovered to be the cause.

As it were, if a semiconductor chip is connected to the die attach within a short time, there is no problem; if a plurality of semiconductor chips are mounted all at once or if some mounted chips are removed and the replacement chips are mounted (the so-called "repair") when there are any defects about some of the semiconductor chips, thermal resistance is not sufficient with the conventional structure.

Accordingly, an object of the present invention is to provide a metallized substrate having a novel structure which can make the connection strength of wire bonding favorable even after heating the semiconductor chips in a mounted state.

Means for Solving the Problems

Hereinafter, the present invention will be described. In order to make the understanding of the present invention easier, reference numerals of the attached drawings are quoted in brackets; however, the present invention is not limited by the embodiment shown in the drawings.

The first aspect of the present invention is a metallized substrate (100) comprising, disposed in the order mentioned: a ceramics substrate (10); a high-melting point metal layer (20); a base nickel plating layer (30); a layered nickel-phosphorous plating layer (40); a diffusion-inhibiting plating layer (50); and a gold plating layer (60), the base nickel plating layer (30) being any one of a nickel plating layer, a nickel-boron plating layer, or a nickel-cobalt plating layer, the diffusion-inhibiting plating layer (50) being any one of a columnar nickel-phosphorous plating layer, a palladium-phosphorous plating layer, or a palladium plating layer.

With respect to the metallized substrate (100) of the first aspect of the invention, by having a base nickel plating layer (30), a plating layer can be formed on the rough surface of the high-melting point metal layer (20) without forming pinholes or voids. On the other hand, it is difficult to obtain a high adhesiveness between the high-melting point metal layer (20) and the base nickel plating layer (30); by thermally treating the base nickel plating layer (30) in a reducing atmosphere, the base nickel plating layer (30) diffuses into the high-melting point metal layer (20) and make the adhesiveness between the high-melting point metal layer (20) and the plating layer favorable. The base nickel plating layer (30) of the invention is made of a metal that is resistant to the thermal treatment.

When the layered nickel-phosphorous plating layer (40) exists, adhesiveness between the base nickel plating layer (30) and the diffusion-inhibiting plating layer (50) becomes favorable. Moreover, the diffusion-inhibiting plating layer (50) can prevent the nickel component of the lower plating layer from diffusing into the gold plating layer (60). As above, since each plating layer has particular functions, metallized substrate (100) of the invention is capable of making the wire bonding property (i.e. the connection strength of wire bonding) favorable even before and after heating of connected semiconductor chips. It should be noted that the "wire bonding property" means two properties, i.e.: a capability to adhesively-connect aluminum wire, gold wire, or the like onto the gold plating layer; and a property in which no peeling occurs between plating layers when wire bonding.

In the first aspect of the invention, an example of the high-melting point metal layer (20) is a layer made of tungsten or molybdenum. The base nickel plating layer (30) is preferably a nickel-boron plating layer. When forming a nickel-boron plating layer which exhibits favorable thermal resistance, it is capable of making adhesiveness with the high-melting point metal layer (20) favorable by high-temperature thermal treatment.

In the first aspect of the invention, the diffusion-inhibiting plating layer (50) is preferably a columnar nickel-phosphorous plating layer. When the gold plating layer (60) is formed directly on the layered nickel-phosphorous plating layer (40), the nickel component derived from the layered nickel-phosphorous plating layer (40) diffuses into the gold plating layer (60) during heating; however, by forming a columnar nickel-phosphorous plating layer on the layered nickel-phosphorous plating layer (40), diffusion of the nickel component can be prevented.

In the first aspect of the invention, the gold plating layer (60) may have a two-layer structure consisting of: substitute gold plating layer or a substitute-reduced gold plating layer; and a reduced gold plating layer formed thereon. First of all, by forming a substitute gold plating layer or a substitute-reduced gold plating layer on the diffusion-inhibiting plating layer (50), it is capable of making adhesiveness favorable between the diffusion-inhibiting plating layer (50) and either the substitute gold plating layer or the substitute-reduced gold plating layer. Then, a reduced gold plating layer is formed on the substitute gold plating layer or the substitute-reduced gold plating layer to obtain a gold plating layer (60) having desired thickness. The film thickness of the gold plating layer (60) thus formed is preferably 0.1 μm or more and 1.0 μm or less.

The second aspect of the present invention is a method for producing metallized substrate (100) comprising the steps of:

forming a base nickel plating layer (30) on a high-melting point metal layer (20) formed on a ceramics substrate (10), by electroless nickel-boron plating, electrolytic nickel plating, or electrolytic nickel-cobalt plating;

thermally treating the ceramic substrate on which the base nickel plating layer (30) is formed, in a reducing atmosphere at a temperature of 700 to 900 degree C.;

forming a layered nickel-phosphorous plating layer (40) on the thermally-treated base nickel plating layer (30) by electroless nickel-phosphorous plating under the condition of (a) or (b):
(a) plating using acid nickel-phosphorous plating bath;
(b) plating using neutral nickel-phosphorous plating bath, followed by thermal treatment in a reducing atmosphere at a temperature of 450 to 900 degree C.;

forming a diffusion-inhibiting plating layer (50) on the layered nickel-phosphorous plating layer (40) in accordance with any one of the following methods (c) to (e):
(c) forming a columnar nickel-phosphorous plating layer by electroless plating using neutral nickel-phosphorous plating bath;
(d) electroless palladium-phosphorous plating; or
(e) electroless palladium plating; and forming a gold plating layer (60) by electroless gold plating on the diffusion-inhibiting plating layer (50).

In the production method of the second aspect of the invention, by thermally treating the base nickel plating layer (30) at high temperature, adhesiveness between the high-melting point metal layer (20) and the base nickel plating layer (30) can be improved. In addition, when a layered nickel-phosphorous plating layer (40) is formed by electroless nickel-phosphorous plating in accordance with a specific method, adhesiveness between the base nickel plating layer (30) and the diffusion-inhibiting plating layer (50) can be improved. Further, by forming the diffusion-inhibiting plating layer (50) in accordance with a specific method, it is capable of preventing the nickel component from diffusing into the gold plating layer. Accordingly, by the production method of the present invention, the metallized substrate which exhibits excellent wire bonding property can be produced.

In the second aspect of the invention, the step for forming the base nickel plating layer (30) is preferably to provide electroless nickel-boron plating.

In the second aspect of the invention, the step for forming the diffusion-inhibiting plating layer (50) is preferably the step (c).

In the second aspect of the invention, the step of forming the gold plating layer (60) is preferably carried out by two-step process consisting of: substitute gold plating or substitute-reduced gold plating over the diffusion-inhibiting plating layer (50); and by reduced gold plating thereafter.

Effects of the Invention

In the metallized substrate of the first aspect of the present invention, by having the base nickel plating layer (30), a plating layer can be formed without forming pinholes or voids on the rough surface of the high-melting point metal layer (20). On the other hand, since it is difficult to obtain a high adhesiveness between the high-melting point metal layer (20) and the base nickel plating layer (30), the base nickel plating layer has to be thermally treated in a reducing atmosphere. By the thermal treatment, the base nickel plating layer (30) diffuses into the high-melting point metal layer (20); thereby adhesiveness between the high-melting point metal layer (20) and the base nickel plating layer can become favorable. The base nickel plating layer (30) of the invention is made of a metal resistant to the thermal treatment.

In addition, when the layered nickel-phosphorous plating layer (40) exists, adhesiveness between the base nickel plating layer (30) and the diffusion-inhibiting plating layer (50) becomes favorable. Moreover, the diffusion-inhibiting plating layer (50) can prevent the nickel component derived from the lower plating layer from diffusing into the gold plating layer (60). As above, since each plating layer has particular functions, metallized substrate (100) of the invention is capable of making the wire bonding property (i.e. the connection strength of wire bonding) favorable even before and after thermal treatment of connected semiconductor chips. It should be noted that the "wire bonding property" means two properties, i.e.: a capability to adhesively-connect aluminum wire, gold wire, or the like onto the gold plating layer; and a property in which no peeling occurs among the plating layers when wire bonding.

DESCRIPTION OF THE REFERENCE NUMERALS

Figure 1:
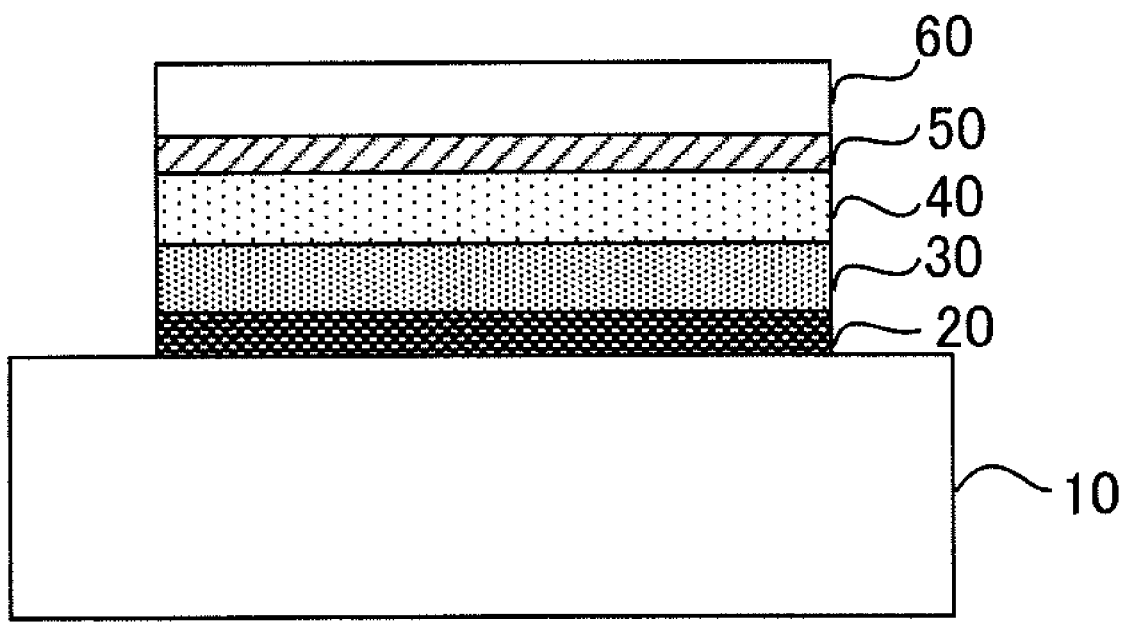
FIG. 1 is a schematic view showing a layer composition of the metallized substrate 100 of the present invention.

| | |
|---|---|
| 10 | ceramics substrate |
| 20 | high-melting point metal layer |
| 30 | base nickel plating layer |
| 40 | layered nickel-phosphorous plating layer |
| 50 | diffusion-inhibiting plating layer |
| 60 | gold plating layer |
| 100 | metallized substrate |

BEST MODE FOR CARRYING OUT THE INVENTION

Hereinafter, the present invention will be described by way of the embodiment shown in the drawings.

<Metallized substrate 100>

As the layer composition is schematically shown in FIG. 1, the metallized substrate 100 of the present invention including, disposed in the order mentioned: a ceramics substrate 10; a high-melting point metal layer 20; a base nickel plating layer 30; a layered nickel-phosphorous plating layer 40; a diffusion-inhibiting plating layer 50; and a gold plating layer 60.

(Ceramics Substrate 10 on which the High-melting Point Metal Layer 20 is Formed)

The ceramic material constituting the ceramics substrate 10 is not particularly limited; examples thereof include: (i) oxide type ceramics such as aluminum oxide, beryllium oxide, and mullite; (ii) nitride type ceramics such as aluminum nitride and silicon nitride; (iii) carbide type ceramics such as silicon carbide; and (iv) glass ceramics containing alumina or silica as the base material. Among them, in view of producing a high-exoergic substrate, aluminum nitride is preferably used.

Examples of high-melting point metal for forming the high-melting point metal layer 20 include tungsten and molybdenum. The high-melting point metal is advantageous that it can be fired at as high temperature as that of firing ceramics. The high-melting point metal layer 20 is formed by applying a high-melting point metal paste at a predetermined position (area) on the substrate and firing thereafter. The high-melting point metal paste may be a conventional paste comprising: high-melting point metal particles; a binder; as required, solvent and sintering aids. Application of the high-melting point metal paste can be carried out in accordance with a known method such as screen printing and calendar printing.

The high-melting point metal layer 20 may be formed in accordance with post-firing method by applying a high-melting point metal paste on the already fired ceramics substrate 10, followed by drying and firing; it may also be formed in accordance with co-firing method by applying the high-melting point metal paste on a ceramics green sheet as a material of the ceramics substrate 10, followed by drying the paste and firing the entire resultant simultaneously.

To the ceramics substrate 10, inner layer wiring can be formed; and vias made of a high-melting point metal can also be formed. Methods for forming the inner layer wiring and vias may be a conventional method.

Hereinafter, each plating layer formed on/above the high-melting point metal layer 20 will be described. It should be noted that the term "plating" of the present invention means methods for forming metal film by precipitating metal from a solution containing metal ions using movement of electron. Among them, "electrolytic plating" means a plating method that the anode gives electron by applying electric current between electrodes using external power supply. On the other hand, "electroless plating" means a plating method without using external power supply; examples thereof include: substitute plating employing ionization tendency, autocatalytic electroless plating (reduced plating) using reducing agent, and substitute-reduced plating as a combination of these two. In the invention, as long as a desired plating layer can be obtained, unless otherwise specified, type of plating solution, and various plating methods of electroless plating or electrolytic plating are not restricted.

(Base Nickel Plating Layer 30)

Examples of the base nickel plating layer 30 include: a nickel plating layer, a nickel-boron plating layer, and a nickel-cobalt plating layer. The base nickel plating layer 30 is a layer configured to improve adhesiveness between the high-melting point metal layer 20 and the layered nickel-phosphorous plating layer 40. Since high adhesiveness with the high-melting point metal layer 20 cannot be obtained unless the base nickel plating layer 30 is thermally treated in a reducing atmosphere; once the base nickel plating layer 30 is formed, thermal treatment must be carried out. Consequently, required metals are the one which are not fused by thermal treatment; a plating layer having high thermal resistance, such as a nickel plating layer, a nickel-boron plating layer, and a nickel-cobalt plating layer, is preferably formed.

Thickness of the base nickel plating layer 30 is not specifically limited. If film thickness is thin, the base nickel plating layer 30 is etched by pretreatment for giving plating layer thereon; on the other hand, if it is thick, peeling and bulge occur due to the stress of plating film, thereby the adhesiveness is lowered. So, the film thickness is preferably 0.2 μm or more and 2.5 μm or less.

When forming the nickel-boron plating layer, electroless plating using dimethyl amine borane as a reducing agent is adopted; when forming a nickel plating layer and a nickel-cobalt plating layer, electrolytic plating is adopted.

The substrate on which the base nickel plating layer 30 is formed is thermally treated in a reducing atmosphere at 700-900 degree C. By the thermal treatment, the base nickel plating layer 30 is diffused into the high-melting point metal layer 20, thereby adhesiveness between them is improved. Materials constituting the base nickel plating layer 30 have thermal resistance to the high thermal treatment. In the invention, "in a reducing atmosphere" means the presence of reducing gas such as hydrogen or nitrogen-hydrogen. Duration of thermal treatment is not specifically limited; it is 5-150 minutes at a temperature of 700 degree C. or more.

(Layered Nickel-phosphorous Plating Layer 40)

The layered nickel-phosphorous plating layer 40 is formed on the base nickel plating layer 30. The layered nickel-phosphorous plating layer 40 is configured to improve adhesiveness between the base nickel plating layer 30 and the diffusion-inhibiting plating layer 50 formed above. For example, if the diffusion-inhibiting plating layer 50 is formed directly on the base nickel plating layer 30, adhesiveness between the base nickel plating layer 30 and the diffusion-inhibiting plating layer 50 is insufficient at wire bonding, thereby peeling may occur between these layers. On the same basis, in the case of gold plating over the diffusion-inhibiting plating layer 50, a gold plating solution firstly erodes the diffusion-inhibiting plating layer 50, then, erodes the base nickel plating layer 30 that results in peeling between these layers. Particularly, it is known that when the diffusion-inhibiting plating layer 50 is the below described columnar nickel-phosphorous plating layer, high thermal resistance can be obtained. However, the columnar nickel-phosphorous plating layer is eroded easily by electroless gold plating layer; therefore, without the layered nickel-phosphorous plating layer 40, peeling tends to occur from the eroded area by wire bonding. The layered nickel-phosphorous plating layer 40 can prevent such interlayer peeling.

Figure 2:
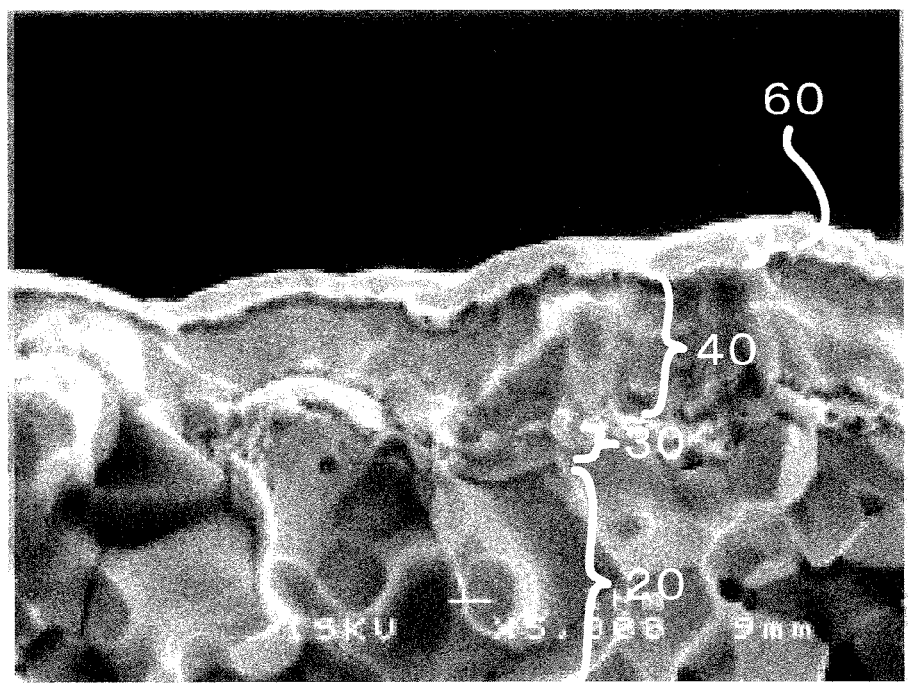
FIG. 2 is a cross-sectional view of the layered nickel-phosphorous plating layer.

The cross-sectional view of the layered nickel-phosphorous plating layer 40 is shown in FIG. 2; FIG. 2 is an electron micrograph at ×5000 magnification. In FIG. 2, it can be seen that on the high-melting point metal layer 20, the base nickel plating layer (nickel-boron plating layer) 30, the layered nickel-phosphorous plating layer 40, and the gold plating layer 60 are formed, in the order mentioned.

Thickness of the layered nickel-phosphorous plating layer 40 is not specifically limited; since the base nickel plating layer does not contain phosphorus, it tends to be eroded easily when contacting with gold plating processing liquid. In view of protecting the base nickel plating layer from the gold plating processing liquid, thickness of the layered nickel-phosphorous plating layer 40 is preferably 0.5 μm or more, and 5 μm or less.

The layered nickel-phosphorous plating layer 40 can be formed in accordance with two methods employing electroless plating using sodium hypophosphite as a reducing agent. The first method is carried out by using an acid nickel-cobalt plating bath. PH of the plating bath is preferably 3.5-5.5, more preferably 4.0-5.3. The second method is carried out by plating using a neutral nickel-phosphorous plating bath, followed by thermal treatment in a reducing atmosphere at a temperature of 450-900 degree C. It should be noted that the term "neutral" means the same as that of the below described diffusion-inhibiting plating layer 50. Duration of the thermal treatment is not particularly limited; for instance, it may be 3-120 minutes at a temperature of 450 degree C. or more.

(Diffusion-inhibiting Plating Layer 50)

On the layered nickel-phosphorous plating layer 40, the diffusion-inhibiting plating layer 50 is formed. The diffusion-inhibiting plating layer 50 is any one of a columnar nickel-phosphorous plating layer, a palladium-phosphorous plating layer, or a palladium plating layer; either of which can prevent the nickel component derived from the lower layer from diffusing into the gold plating layer 60.

Thickness of the diffusion-inhibiting plating layer 50 is not specifically limited; in view of adhesiveness and economic efficiency, it is preferably 0.05 μm or more and 1.0 μm or less.

Figure 3:
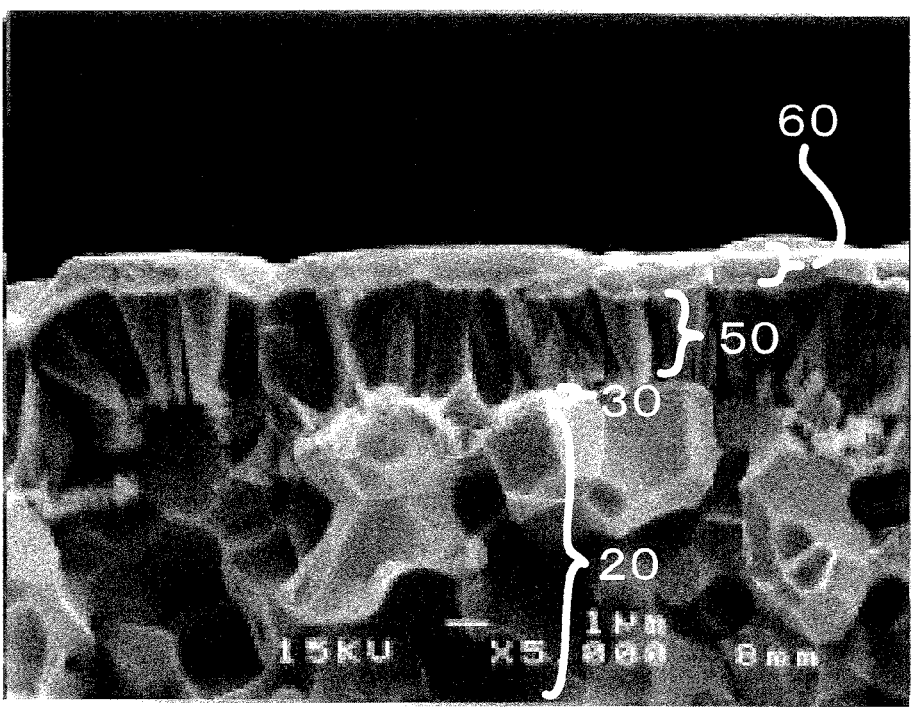
FIG. 3 is a cross-sectional view of the columnar nickel-phosphorous plating layer.

The columnar nickel-phosphorous plating layer can be formed by electroless plating using a neutral nickel-phosphorous plating bath. The term "neutral" means that the solution is pH 5.6-7.3, preferably pH 6.0-7.0. When employing the solution prepared at a pH within the range, columnar nickel-phosphorous film can be preferably formed. The cross-sectional view of the columnar nickel-phosphorous plating layer is shown in FIG. 3; FIG. 3 is an electron micrograph at ×5000 magnification. In FIG. 3, it can be seen that on the high-melting point metal layer 20, the base nickel plating layer (nickel-boron plating layer) 30, the diffusion-inhibiting plating layer (columnar nickel-phosphorous plating layer) 50, and the gold plating layer 60 are formed, in the order mentioned. As seen from the comparison between FIGS. 2 and 3, layer structures between the layered nickel-phosphorous plating layer (FIG. 2) and the columnar nickel-phosphorous plating layer (FIG. 3) are clearly different. The layered nickel-phosphorous plating layer of FIG. 2 has a homogenous cross section; on the other hand, the columnar nickel-phosphorus plating layer of FIG. 3 has a shape in which a plurality of columns extended in the vertical direction (of the figure) form a line in the right-and-left direction. The present inventors had discovered that these nickel-phosphorus plating layers having different structure respectively show different performance; and they had completed the present invention.

The palladium-phosphorous plating layer may be, but not restricted, a palladium precipitate film formed on the surface of the layered nickel-phosphorous plating layer 40 employing palladium ion in the plating solution with aid of reducing agent. On the other hand, the palladium plating layer may be, but not restricted, a palladium film formed by substitute reaction of the nickel of the layered nickel-phosphorous plating layer 40 with palladium ion in the plating solution.

(Gold Plating Layer 60)

On the diffusion-inhibiting plating layer 50, a gold plating layer 60 is formed. The gold plating includes not only plating of pure gold but also plating of gold alloy mainly containing gold. The gold plating layer 60 is the uppermost plating, on which semiconductor chips are connected and wire-bonded. Thickness of the gold plating layer 60 is not specifically limited; in view of wire bonding property and economic efficiency, is preferably 0.1 μm or more and 1.0 μm or less.

The gold plating layer 60 is formed by electroless plating, any one of substitute-type, reduced-type, or substitute-reduced-type as the combination of these two may be adopted. Substitute plating or substitute-reduced plating has an advantage of improving adhesiveness with the diffusion-inhibiting plating layer 50. Reduced plating has an advantage of thickening the layer. Accordingly, by adopting two-step process having the steps of: substitute plating or substitute-reduced plating to form a thinner gold plating layer; and reduced plating thereon, it is capable of forming the gold plating layer 60 having thicker layer and favorable adhesiveness.

<Method for Producing Metallized Substrate 100>

The method for producing metallized substrate 100 of the present invention including the steps of: forming a base nickel plating layer 30 on a high-melting point metal layer 20 formed on a ceramics substrate 10; thermally treating under a certain condition; forming a layered nickel-phosphorous plating layer 40; forming a diffusion-inhibiting plating layer 50; and forming a gold plating layer. Detailed description of each step is as above.

The metallized substrate 100 of the present invention is used for mounting semiconductor chips thereon. It can make connection strength of the wire bonding favorable even after heating at mounting semiconductor chips.

EXAMPLES

Hereinafter, the invention will be more specifically described by way of the following examples. The invention will not be restricted by these Examples.

Example 1

A material substrate made of a sintered aluminum nitride substrate obtained by sintering aluminum nitride powder having an average diameter of 1.5 μm added with yttrium oxide as sintering aids was prepared. In addition to this, 86 mass % of tungsten powder having an average diameter of 2 μm, 7 mass % of aluminum nitride powder having a primary average diameter of 0.6 μm, 1 mass % of yttrium oxide powder, and binder including ethyl cellulose, plasticizer, and dispersant were mixed and kneaded firstly in automatic mortar, later in a three-roll mill to prepare a high-melting point metal paste having a viscosity of 120 Pa·s.

The high-melting point metal paste was printed employing screen printing method on the sintered aluminum nitride substrate such that a particular pattern having 2 mm square region were printed in a 24×24 matrix. The obtained substrate was defatted at 850 degree C. for 2 hours in a hydrogen gas atmosphere; thereafter, it was fired at 1750 degree C. for 4 hours to obtain a substrate having a high-melting point metal layer on the surface.

The high-melting point metal layer thus obtained was coated by a nickel-boron film having thickness of 1.2 μm employing an electroless plating system; followed by thermal treatment at 850 degree C. for 2 hours in a hydrogen gas atmosphere to form a base nickel plating layer. Then, after acid cleaning, a layered nickel-phosphorous plating layer having thickness of 2 μm was formed using an electroless nickel-phosphorous plating liquid at pH 5.0. Further, on the layered nickel-phosphorous plating layer, by using an electroless palladium-phosphorous plating solution, a palladium-phosphorous plating layer having thickness of 0.15 μm was formed as the diffusion-inhibiting plating layer.

Thereafter, a gold plating layer having a thickness of 0.3 μm was formed using an electroless substitute-reduced gold plating solution and an electroless reduced gold plating solution to produce a metallized substrate.

To evaluate the thermal resistance, the obtained metallized substrate was heated at 350 degree C. for 10 minutes in the atmosphere and then wire bonding was carried out at 20 spots employing a gold wire having a diameter of 25 μm. After wire bonding, tensile fracture mode of the wires was observed. The results are shown in Table 1. As seen from the table, the metallized substrate of Example 1 shows favorable wire bonding property. Among the 20 spots, none of them was improperly bonded whereby neck-break occurred about all the wires.

Example 2

In the same manner as Example 1, a substrate having a high-melting point metal layer was produced and a base nickel plating layer was formed on the high-melting point metal layer. Following to this, acid cleaning was carried out; then, a columnar nickel-phosphorous plating layer having a thickness of 2 μm was formed using neutral electroless nickel-phosphorous plating solution at pH 6.5 and thermally treated at 500 degree C. for 5 minutes in a hydrogen gas atmosphere to form a layered nickel-phosphorous plating layer having a thickness of 2 μm. Further, using an electroless palladium-phosphorous plating solution, a palladium-phosphorous plating layer having a thickness of 0.15 μm was formed as a diffusion-inhibiting plating layer. Finally, a gold plating layer having a thickness of 0.3 μm was formed using an electroless substitute gold plating solution and an electroless reduced gold plating solution, to produce a metallized substrate.

The obtained metallized substrate was heated at 350 degree C. for 10 minutes in the atmosphere; and then wire bonding was carried out at 20 spots employing a gold wire having a diameter of 25 μm. After wire bonding, tensile fracture mode of the wires was observed. The results are shown in Table 1. As seen from the table, the metallized substrate of Example 2 shows favorable wire bonding property.

Example 3

In the same manner as Example 1, a substrate having a high-melting point metal layer was produced and a base nickel plating layer was formed on the high-melting point metal layer. Following to this, acid cleaning was carried out; then, a layered nickel-phosphorous plating layer having a thickness of 2 μm was formed using acid electroless nickel-phosphorous plating solution at pH 5.0. Further, using a neutral electroless nickel-phosphorous plating solution at pH 6.5, a columnar nickel-phosphorous plating layer having a thickness of 0.3 μm was formed as a diffusion-inhibiting plating layer. Finally, a gold plating layer having a thickness of 0.5 μm was formed using an electroless substitute gold plating solution and an electroless reduced gold plating solution, to produce a metallized substrate.

The obtained metallized substrate was heated at 350 degree C. for 10 minutes in the atmosphere; and then wire bonding was carried out at 20 spots employing a gold wire having a diameter of 25 μm. After wire bonding, tensile fracture mode of the wires was observed. The results are shown in Table 1. As seen from the table, the metallized substrate of Example 3 shows favorable wire bonding property.

Example 4

In the same manner as Example 1, a substrate having a high-melting point metal layer was produced and a base nickel plating layer was formed on the high-melting point metal layer. Following to this, acid cleaning was carried out; then, a columnar nickel-phosphorous plating layer having a thickness of 2 μm was formed as a layered nickel-phosphorous plating layer using neutral electroless nickel-phosphorous plating solution at pH 6.5 and thermally treated at 500 degree C. for 5 minutes in a hydrogen gas atmosphere. Further, using a nutral electroless nickel-phosphorous plating solution at pH 6.5, a columnar nickel-phosphorous plating layer having a thickness of 0.3 μm was formed as a diffusion-inhibiting plating layer. Finally, a gold plating layer having a thickness of 0.5 μm was formed using an electroless substitute-reduced gold plating solution and an electroless reduced gold plating solution, to produce a metallized substrate.

The obtained metallized substrate was heated at 350 degree C. for 10 minutes in the atmosphere; and then wire bonding was carried out at 20 spots employing a gold wire having a diameter of 25 μm. After wire bonding, tensile fracture mode of the wires was observed. The results are shown in Table 1. As seen from the table, the metallized substrate of Example 4 shows favorable wire bonding property.

Example 5

In the same manner as Example 1, a metallized substrate having a high-melting point metal was produced. Thereafter, by electrolytic barrel plating employing nickel electrodes, the high-melting point metal layer was coated with a nickel film having a thickness of 1.2 μm; then, it was thermally treated at 850 degree C. for 2 hours in a hydrogen atmosphere to form a base nickel plating layer.

After acid cleaning, a layered nickel-phosphorous plating layer having a thickness of 2 μm was formed using electroless nickel-phosphorous plating solution at pH 5.0. Further, using an electroless palladium-phosphorous plating solution, a palladium-phosphorous plating layer having a thickness of 0.15 μm was formed as a diffusion-inhibiting plating layer. Finally, using an electroless substitute-reduced gold plating solution and an electroless reduced gold plating solution, a gold plating layer having a thickness of 0.3 μm was formed, to produce a metallized substrate.

The obtained metallized substrate was heated at 350 degree C. for 10 minutes in the atmosphere; and then wire bonding was carried out at 20 spots employing a gold wire having a diameter of 25 μm. After wire bonding, tensile fracture mode of the wires was observed. The results are shown in Table 1. As seen from the table, the metallized substrate of Example 5 shows favorable wire bonding property.

Example 6

In the same manner as Example 1, a metallized substrate having a high-melting point metal was produced. Thereafter, by electrolytic barrel plating employing nickel electrodes containing cobalt, the high-melting point metal layer was coated with a nickel-cobalt film having a thickness of 1.2 μm; then, it was thermally treated at 850 degree C. for 2 hours in a hydrogen atmosphere to form a base nickel plating layer.

Thereafter, acid cleaning was carried out, and then a layered nickel-phosphorous plating layer having a thickness of 2 μm was formed using an electroless nickel-phosphorous plating solution at pH 5.0. Still further, by using an electroless palladium-phosphorous plating solution, a palladium-phosphorous plating layer having a thickness of 0.15 μm was formed as a diffusion-inhibiting plating layer. Finally, a gold plating layer having a thickness of 0.3 μm was formed using an electroless substitute-reduced gold plating solution and an electroless reduced gold plating solution, to produce a metallized substrate.

The obtained metallized substrate was heated at 350 degree C. for 10 minutes in the atmosphere; and then wire bonding was carried out at 20 spots employing a gold wire having a diameter of 25 μm. After wire bonding, tensile fracture mode of the wires was observed. The results are shown in Table 1. As seen from the table, the metallized substrate of Example 6 shows favorable wire bonding property.

Example 7

In the same manner as Example 1, a substrate having a high-melting point metal layer was produced and a base nickel plating layer was formed on the high-melting point metal layer. Later, in the same manner as Example 1, a layered nickel-phosphorous plating layer having a thickness of 2 μm was formed. Further, on the nickel-phosphorous plating layer, by using a substitute-type electroless palladium plating solution, a palladium plating layer having a thickness of 0.1 μm was formed as a diffusion-inhibiting plating layer. Finally, a gold plating layer having a thickness of 0.3 μm was formed using an electroless substitute-reduced gold plating solution and an electroless reduced gold plating solution, to produce a metallized substrate.

The obtained metallized substrate was heated at 350 degree C. for 10 minutes in the atmosphere; and then wire bonding was carried out at 20 spots employing a gold wire having a diameter of 25 μm. After wire bonding, tensile fracture mode of the wires was observed. The results are shown in Table 1. As seen from the table, the metallized substrate of Example 7 shows favorable wire bonding property.

Comparative Example 1

In the same manner as Example 1, a substrate having a high-melting point metal layer was produced and a base nickel plating layer was formed on the high-melting point metal layer. Later, acid cleaning was carried out; then, a columnar nickel-phosphorous plating layer having a thickness of 2 μm was formed using a neutral electroless nickel-phosphorous plating solution at pH 6.5. Thereafter, instead of forming a diffusion-inhibiting plating layer thereon, a gold plating layer having a thickness of 0.5 μm was formed using an electroless substitute gold plating solution and an electroless reduced gold plating solution, to produce a metallized substrate.

The obtained metallized substrate was heated at 350 degree C. for 10 minutes in the atmosphere; and then wire bonding was carried out at 20 spots employing a gold wire having a diameter of 25 μm. Although wires were properly bonded, when performing the tensile test of wire after wire bonding, interface peeling between the nickel-boron plating layer and the nickel-phosphorus plating layer occurred at 2 out of 20 spots.

Comparative Example 2

In the same manner as Example 1, a substrate having a high-melting point metal layer was produced and a base nickel plating layer was formed on the high-melting point metal layer. Later, acid cleaning was carried out; then, a columnar nickel-phosphorous plating layer having a thickness of 0.3 μm was formed using a neutral electroless nickel-phosphorous plating solution at pH 6.5. Further, a gold plating layer having a thickness of 0.5 μm using an electroless substitute gold plating solution and an electroless reduced gold plating solution, to produce a metallized substrate.

The obtained metallized substrate was heated at 350 degree C. for 10 minutes in the atmosphere; and then wire bonding was carried out at 20 spots employing a gold wire having a diameter of 25 μm. Although wires were properly bonded, when performing the tensile test of wire after wire bonding, interface peeling between the nickel-boron plating layer and the nickel-phosphorous plating layer occurred at 8 out of 20 spots.

Comparative Example 3

In the same manner as Example 1, a substrate having a high-melting point metal layer was produced and a base nickel plating layer was formed on the high-melting point metal layer. Later, acid cleaning was carried out; then, a layered nickel-phosphorous plating layer having a thickness of 2 μm was formed using an acid electroless nickel-phosphorous plating solution at pH 5.0. Further, instead of forming a diffusion-inhibiting plating layer, a gold plating layer having a thickness of 0.5 μm using an electroless substitute gold plating solution and an electroless reduced gold plating solution, to produce a metallized substrate.

The obtained metallized substrate was heated at 350 degree C. for 10 minutes in the atmosphere; then, wire bonding was carried out at 20 spots employing a gold wire having a diameter of 25 μm. Wires of 15 out of 20 spots were not properly bonded. When performing tensile test about the remaining 5 spots of the properly-bonded wires, peeling between the wires and the plating layer occurred at 3 spots.

Comparative Example 4

In the same manner as Example 1, a substrate having a high-melting point metal layer was produced and a base nickel plating layer was formed on the high-melting point metal layer. Later, acid cleaning was carried out; then, a layered nickel-phosphorous plating layer having a thickness of 2 μm was formed using an acid electroless nickel-phosphorous plating solution at pH 5.0. Thereafter, instead of forming a diffusion-inhibiting plating layer, a gold plating layer having a thickness of 0.5 μm was formed using an electroless substitute-reduced gold plating solution and an electroless reduced gold plating solution, to produce a metallized substrate.

The obtained metallized substrate was heated at 350 degree C. for 10 minutes in the atmosphere; then, wire bonding was carried out at 20 spots employing a gold wire having a diameter of 25 μm. Wires of 8 out of 20 spots were not properly bonded. When performing tensile test about remaining 12 spots of the properly-bonded wires, peeling between the wires and the plating layer occurred at 8 spots.

Comparative Example 5

In the same manner as Example 1, a metallized substrate having a high-melting point metal was produced. Then, instead of forming a base nickel plating layer, a layered nickel-phosphorous plating layer having a thickness of 2 μm was formed on the high-melting point metal layer using an electroless nickel-phosphorous plating solution at pH 5.0. Further, on the nickel-phosphorous plating layer, by using electroless palladium-phosphorous plating solution, a palladium-phosphorous plating layer having a thickness of 0.15 μm was formed as a diffusion-inhibiting plating layer. Finally, a gold plating layer having a thickness of 0.3 μm was formed thereon using an electroless substitute-reduced gold plating solution and an electroless reduced gold plating solution, to produce a metallized substrate.

The obtained metallized substrate was heated at 350 degree C. for 10 minutes in the atmosphere; then, wire bonding was carried out at 20 spots employing a gold wire having a diameter of 25 µm. After that, tensile fracture mode was observed about these wires. The results are shown in Table 1. When performing the test, peeling between the wires and plated film occurred (all of wires at 20 spots were not bonded.). On the other hand, when observing samples heated at 350 degree C. for 10 minutes in the atmosphere, bulge occurred in the plating layer.

Comparative Example 6

In the same manner as Example 1, a metallized substrate having a high-melting point metal was produced. Later, a nickel-boron plating layer having a thickness of 2 µm was formed using an electroless plating system. Further, on the nickel-boron plating layer, a palladium-phosphorous plating layer having a thickness of 0.15 µm was formed as a diffusion-inhibiting plating layer using an electroless palladium-phosphorous plating solution. Finally, a gold plating layer having a thickness of 0.3 µm was formed using an electroless substitute-reduced gold plating solution and an electroless reduced gold plating solution, to produce a metallized substrate.

The obtained metallized substrate was heated at 350 degree C. for 10 minutes in the atmosphere; then, wire bonding was carried out at 20 spots employing a gold wire having a diameter of 25 µm. All of the wires at 20 spots were not properly bonded. When wire bonding regarding these samples, interface peeling between the nickel-boron plating layer and the palladium-phosphorous plating layer, or inter-layer peeling of the nickel-boron plating layer occurred.

Comparative Example 7

In the same manner as Example 1, a substrate having a high-melting point metal layer was formed and a base nickel plating layer was formed on the high-melting point metal layer. Thereafter, acid cleaning was carried out; then, a nickel-boron plating layer having a thickness of 2 µm was formed using an electroless plating system. Further, by using an electroless palladium-phosphorous plating solution, a palladium-phosphorous plating layer having a thickness of 0.15 µm was formed as a diffusion-inhibiting plating layer. Finally, a gold plating layer having a thickness of 0.3 µm using an electroless substitute-reduced gold plating solution and an electroless reduced gold plating solution, to produce a metallized substrate.

The obtained metallized substrate was heated at 350 degree C. for 10 minutes in the atmosphere; and then wire bonding was carried out at 20 spots employing a gold wire having a diameter of 25 µm. Although wires were properly bonded, when performing tensile test of the wires after bonding, interface peeling between the nickel-boron plating layer and the palladium-phosphorous plating layer, or inter-layer peeling of nickel-boron plating layer occurred at 5 out of 20 spots.

TABLE 1

| | Base Ni plating layer | | Plating layers on Base Ni plating layer | | | Diffusion-inhibiting layer | | Gold plating layer | | Wire bonding after heating | |
|---|---|---|---|---|---|---|---|---|---|---|---|
| | Type of film | Film thickness (µm) | Type of film | Film thickness (µm) | Shape of film | Film producing method | Type of film | Film thickness (µm) | Shape of film | Film thickness (µm) | Type of film-making solution | Number of bonding failure | Fracture mode |
| Example 1 | Ni—B | 1.2 | Ni—P | 2 | Layered | pH 5.0 | Pd—P | 0.15 | — | 0.3 | Substitute reduced/Reduced | 0/20 | All/Neck-break |
| Example 2 | Ni—B | 1.2 | Ni—P | 2 | Layered | 500° C. sintering | Pd—P | 0.15 | — | 0.3 | Substitute/Reduced | 0/20 | All/Neck-break |
| Example 3 | Ni—B | 1.2 | Ni—P | 2 | Layered | pH 5.0 | Ni—P | 0.30 | Columnar | 0.5 | Substitute/Reduced | 0/20 | All/Neck-break |
| Example 4 | Ni—B | 1.2 | Ni—P | 2 | Layered | 500° C. sintering | Ni—P | 0.30 | Columnar | 0.5 | Substitute reduced/Reduced | 0/20 | All/Neck-break |
| Example 5 | Ni | 1.2 | Ni—P | 2 | Layered | pH 5.0 | Pd—P | 0.15 | — | 0.3 | Substitute reduced/Reduced | 0/20 | All/Neck-break |
| Example 6 | Ni—Co | 1.2 | Ni—P | 2 | Layered | pH 5.0 | Pd—P | 0.15 | — | 0.3 | Substitute reduced/Reduced | 0/20 | All/Neck-break |
| Example 7 | Ni—B | 1.2 | Ni—P | 2 | Layered | pH 5.0 | Pd | 0.1 | — | 0.3 | Substitute reduced/Reduced | 0/20 | All/Neck-break |
| Comparative example 1 | Ni—B | 1.2 | Ni—P | 2 | Columnar | pH 6.5 | — | — | — | 0.5 | Substitute/Reduced | 0/20 | Partial/Film peeling (2/20) |
| Comparative example 2 | Ni—B | 1.2 | — | — | — | — | Ni—P | 0.3 | Columnar | 0.5 | Substitute/Reduced | 0/20 | Partial/Film peeling (8/20) |
| Comparative example 3 | Ni—B | 1.2 | Ni—P | 2 | Layered | pH 5.0 | — | — | — | 0.5 | Substitute/Reduced | 15/20 | Partial/Wire peeling (3/5) |
| Comparative example 4 | Ni—B | 1.2 | Ni—P | 2 | Layered | pH 5.0 | — | — | — | 0.5 | Substitute reduced/Reduced | 8/20 | Partial/Wire peeling (8/12) |
| Comparative example 5 | — | — | Ni—P | 2 | Layered | pH 5.0 | Pd—P | 0.15 | — | 0.3 | Substitute reduced/Reduced | 20/20 | All/Film peeling |

TABLE 1-continued

| | Base Ni plating layer | | Plating layers on Base Ni plating layer | | | Diffusion-inhibiting layer | | Gold plating layer | | Wire bonding after heating | |
|---|---|---|---|---|---|---|---|---|---|---|---|
| | Type of film | Film thickness (μm) | Type of film | Film thickness (μm) | Shape of film | producing method | Type of film | Film thickness (μm) | Shape of film | Film thickness (μm) | film-making solution | Number of bonding failure | Fracture mode |
| Comparative example 6 | — | — | Ni—B | 2 | — | — | Pd—P | 0.15 | — | 0.3 | Substitute reduced/ Reduced | 20/20 | All/Film peeling |
| Comparative example 7 | Ni—B | 1.2 | Ni—B | 2 | — | — | Pd—P | 0.15 | — | 0.3 | Substitute reduced/ Reduced | 0/20 | Partial/Film peeling (5/20) |

The above has described the present invention associated with the most practical and preferred embodiments thereof. However, the invention is not limited to the embodiments disclosed in the specification. Thus, the invention can be appropriately varied as long as the variation is not contrary to the subject substance and conception of the invention which can be read out from the claims and the whole contents of the specification. It should be understood that a metallized substrate and the method for producing the metallized substrate with such an alternation are included in the technical scope of the invention.

Industrial Applicability

The metallized substrate of the present invention is used as a metallized substrate for mounting semiconductor chips.

The invention claimed is:

1. A method for producing metallized substrate comprising the steps of:
   forming a base nickel plating layer on a high-melting point metal layer formed on a ceramics substrate, by electroless nickel-boron plating, electrolytic nickel plating, or electrolytic nickel-cobalt plating, said high-melting point metal being molybdenum or tungsten,
   thermally treating the ceramic substrate on which the base nickel plating layer is formed, in a reducing atmosphere at a temperature of 700 to 900 degree C.;
   forming a layered nickel-phosphorus plating layer on the thermally-treated base nickel plating layer by electroless nickel-phosphorus plating under the condition of (a) or (b):
   (a) plating using acid nickel-phosphorus plating bath whose pH is lower than 5.6;
   (b) plating using neutral nickel-phosphorus plating bath whose pH is 5.6 to 7.3, followed by thermal treatment in a reducing atmosphere at a temperature of 450 to 900 degree C.;
   forming a diffusion-inhibiting plating layer on the layered nickel-phosphorus plating layer in accordance with any one of the following methods (c) to (e):
   (c) forming a columnar nickel-phosphorus plating layer by electroless plating using neutral nickel-phosphorus plating bath whose pH is 5.6 to 7.3;
   (d) electroless palladium-phosphorus plating; or
   (e) electroless palladium plating; and
   forming a gold plating layer by electroless gold plating on the diffusion-inhibiting plating layer.

2. The method for producing metallized substrate according to claim 1, wherein the step for forming the base nickel plating layer is to provide electroless nickel-boron plating.

3. The method for producing metallized substrate according to claim 1, wherein the step for forming the diffusion-inhibiting plating layer is the step (c).

4. The method for producing metallized substrate according to claim 1, wherein the step of forming the gold plating layer is carried out by two-step process consisting of: substitution gold plating or substitution-reduction gold plating over the diffusion-inhibiting plating layer; and reduction gold plating thereafter.

5. The method for producing metallized substrate according to claim 1, wherein the step of forming the diffusion-inhibiting plating layer is the step (d) or the step (e).

* * * * *